United States Patent [19]

Bergh

[11] Patent Number: 4,540,088
[45] Date of Patent: Sep. 10, 1985

[54] COMPONENT CONVEYOR APPARATUS

[75] Inventor: John C. Bergh, Elkhart, Ind.

[73] Assignee: Wheelabrator-Frye Inc., Mishawaka, Ind.

[21] Appl. No.: 506,008

[22] Filed: Jun. 20, 1983

[51] Int. Cl.³ .............................................. B65G 49/06
[52] U.S. Cl. ................................ 198/803.15; 134/126; 134/131; 198/803.9
[58] Field of Search ............... 198/653, 652, 649, 654, 198/650, 694, 696, 688, 695; 134/124, 125, 126, 131

[56] References Cited

U.S. PATENT DOCUMENTS

| | | | |
|---|---|---|---|
| 681,603 | 8/1901 | Yorke | 198/654 |
| 2,626,701 | 1/1953 | Avetta et al. | 198/653 |
| 2,948,633 | 8/1960 | Schriner et al. | 198/688 |
| 3,308,544 | 3/1967 | White | 198/654 |
| 4,281,675 | 8/1981 | Pure | 198/649 |

FOREIGN PATENT DOCUMENTS 48532   9/1966   German Democratic Rep. ..................................... 198/653

Primary Examiner—Joseph E. Valenza
Assistant Examiner—Kyle E. Shane
Attorney, Agent, or Firm—McDougall, Hersh & Scott

[57] ABSTRACT

A conveyor apparatus for transporting elongated, flat electronic component assemblies or the like through a surface treatment chamber in a predetermined orientation. A continuous belt is provided with two parallel spaced rows of retention pins which are automatically separated in the loading zone to facilitate positioning of the assemblies on the conveyor. A wedge-shaped shoe member forces the respective pins transversely outwardly and is provided with an aperture permitting the insertion of the assemblies therethrough. Secure retention of the assemblies in the treatment chamber is assured by an inverted U-shaped channel which urges the retention pins into engagement with the component assemblies. The pins may be bent outwardly to enhance the compressive forces exerted by the pin pairs comprising the respective rows. A center-ribbed exit belt pulley deforms the belt along its longitudinal center axis thereby spreading the pin rows to aid removal of the assemblies following surface treatment. A U-shaped pin member defines a pair of retention pins. Each pin member is positioned in a given pin row thereby maintaining maximum belt flexibility enabling belt deformation over the ribbed exit pulley.

9 Claims, 14 Drawing Figures

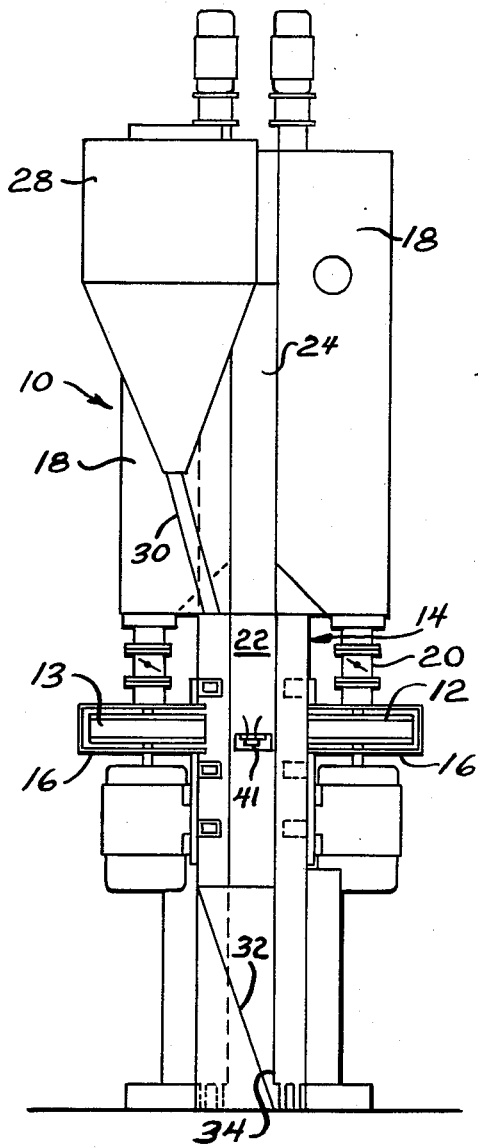
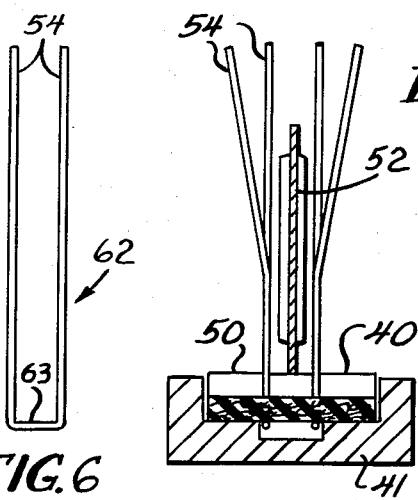
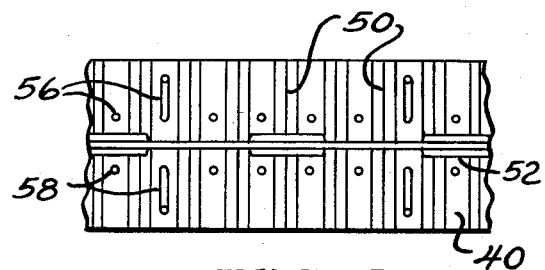
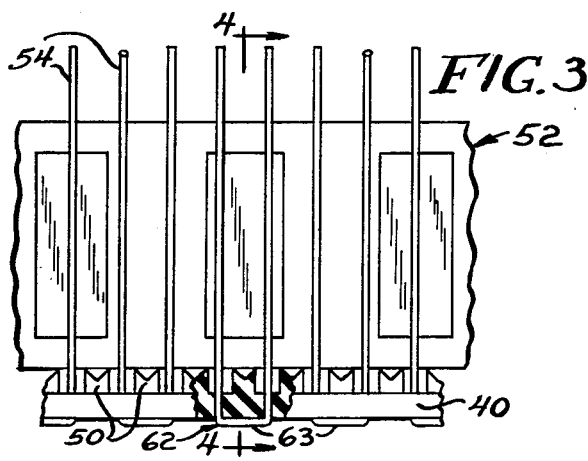
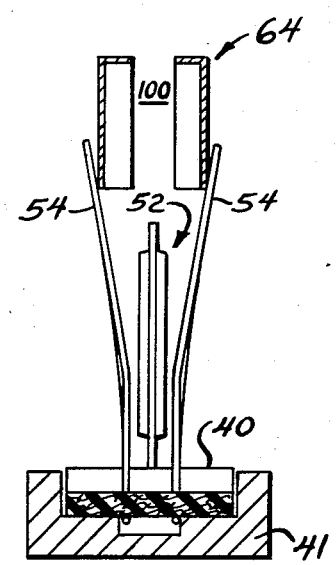

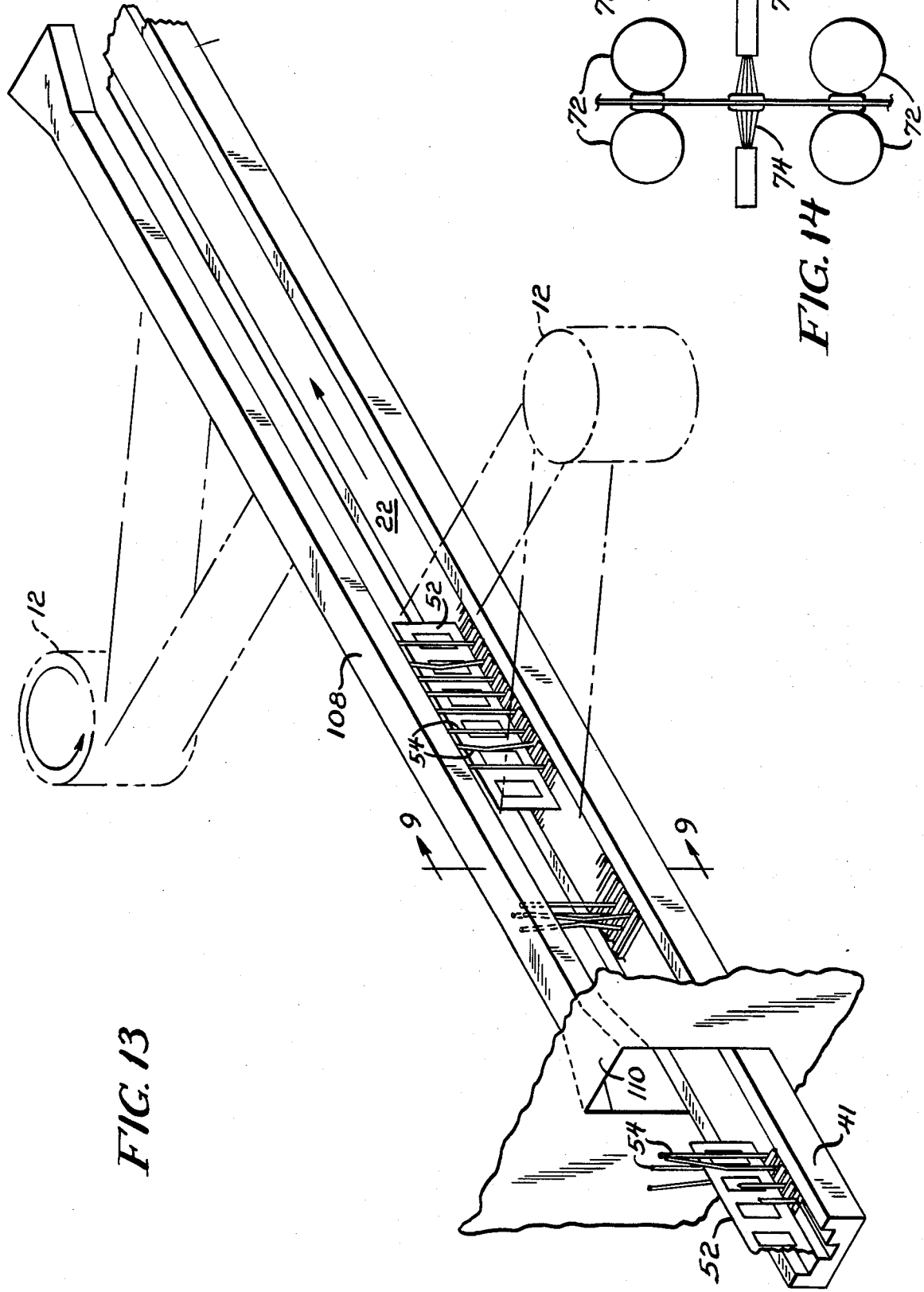

COMPONENT CONVEYOR APPARATUS

The present invention relates to conveyors for surface treatment apparatus and, more particularly, to a conveyor for retaining and advancing elongated electronic component assemblies, such as a ribbon-like strip of plastic encapsulated integrated circuits, through a surface treatment chamber.

In the assembly of integrated circuits a plurality of semiconductor 'chips' are arranged and bonded to an integral ribbon-like punched metal pin matrix. Thereafter, the integrated circuit assembly is placed in a plastic or epoxy molding apparatus thereby simultaneously encapsulating the chips against subsequent contamination or physical damage. This encapsulation process typically leaves excess plastic flash material between the individual pins associated with each integrated circuit. This material must be removed by surface treatment apparatus prior to final IC pin separation, trimming and bending.

Surface treatment equipment is available for removing the plastic or epoxy flash material between the integrated circuit pins. This known equipment provides surface treatment either by an air blast nozzle or by a centrifugal blast wheel. In the case of the centrifugal blast wheel, a soft abrasive media is employed. The present invention relates to a specialized conveyor and conveyor structure particularly suited for retaining and moving the generally flat, ribbon-like integrated circuit assemblies in a predetermined orientation and path with respect to the treatment apparatus.

Conveyors for advancing electronic components are well known. Such conveyors, however, are generally adapted for movement of individual axial components and are unsuited for the larger integrated circuit ribbon-like strips for which the present invention was developed. In particular, the location of the excess flashing between adjacent integrated circuit pins requires that the blast of air or abrasive material from the treatment equipment be directed in substantially normal relationship to the ribbon-like surface defined by the unformed integrated circuit pins. Unlike the conveyors for axially symmetric components, for example diodes and resistors, the present conveyor must maintain each IC assembly in a fixed vertical orientation with respect to the treatment apparatus. Additionally, the relatively large surface area associated with each integrated circuit assembly requires a conveyor having a substantially greater retention capability than necessary to secure small axial components such as, for example, diodes.

It is known in the prior art to provide conveyors for advancing articles, such as coil springs, through the treatment chamber of a surface cleaning apparatus. For example, U.S. Pat. Nos. 3,383,803 and 3,604,158, each assigned to the assignee of the present invention, disclose conveyors for the surface treatment of coil springs. The conveyors shown in these prior art patents, however, are not suitable for relatively flat, ribbon-like articles, such as the integrated circuit assemblies under consideration herein.

It is known in the prior art to provide conveyors for advancing electronic axial components through the treatment chamber of a surface treatment apparatus. One form of such conveyors includes endless chains with recesses in each link to receive the lead wires. Another form includes endless rubber belts having a saw-tooth configuration to define spaces for receiving the component lead wires. These conveyors are simply not designed, and therefore can not function, to contain and convey the IC assemblies considered herein.

By contrast, the conveyor of the present invention utilizes parallel longitudinal rows of fingers or pins spaced along a continuous, circular conveyor belt to retain the flat IC assemblies. A wedged separator shoe is provided which automatically urges the parallel rows of pins transversely outwardly thereby creating a longitudinal opening between the respective rows to receive the IC assemblies. As the assemblies to be de-flashed move into the surface treatment chamber, the ends of the paired fingers, defining the parallel rows, enter an inverted U-shaped channel guide member which functions to urge the finger pairs transversely inwardly into secure engagement with the IC assembly positioned therebetween. It will be appreciated that the present structure is adapted to freely receive generally flat elongated assemblies while providing substantial assembly clamping capability suitable for retention of relatively large component assemblies under severe surface treatment air or abrasive particle forces.

It is therefore an object of the present invention to provide a component conveyor apparatus for moving electronic or other components through a surface treatment chamber. The conveyor shall be adapted to receive, retain and convey relatively flat, elongated component assemblies, for example, multiple integrated circuit chips along a ribbon-like pin matrix. The retention means shall consist of a pair of spaced longitudinal rows of fingers or wire pins along a continuous circular conveyor belt. A wedge-shaped shoe shall be positioned between the respective rows to force the members outwardly thereby creating an opening between the pins of sufficient width to readily receive the component assembly. The conveyor belt shall pass from the loading zone to the surface treatment chamber wherein a channel is provided which contacts the upper ends of the pins thereby forcing the pins into secure engagement with the component therebetween.

It is a further object to provide an arrangement whereby the component assemblies are effortlessly removed or ejected from the conveyor following surface treatment and/or cleaning. A center-ribbed terminal conveyor belt pulley may be provided to momentarily crease or distort the belt thereby pivoting the pins outwardly. The linear momentum of the component assemblies shall carry the assemblies from engagement with the conveyor system as the parted finger pairs pass over the terminal pulley or, alternatively, the assemblies may simply be removed from the separated pins.

BRIEF DESCRIPTION OF THE FIGURES

FIG. 2 is an elevation view of the exit end of the surface treatment apparatus and conveyor assembly of FIG. 1;

FIG. 3 is a fragmentary side elevation view of the conveyor belt and retention pin structure showing a component assembly positioned thereon;

FIG. 4 is a sectional view taken along line 4—4 of FIG. 3 depicting the conveyor belt and retention pins further showing the belt guide channel; the pins are in the nominal undeflected position;

FIG. 5 is a fragmentary plan view of the conveyor belt and pins of the present invention with a component assembly positioned thereon;

FIG. 6 is a side elevation view of two pins comprising a U-shaped pin member;

FIG. 7 is a sectional view of the loading zone with retention pins rotated outwardly by the slotted wedge shoe of the present invention;

FIG. 13 is a perspective view of the conveyor assembly in the surface treatment chamber depicting the upper U-shaped pin constricting channel of the present invention; and FIG. 14 is a fragmentary view taken along line 14—14 of FIG. 1 showing the component assembly cleaning brushes and sponge drive rollers.

DESCRIPTION OF PREFERRED EMBODIMENT

Figure 1:
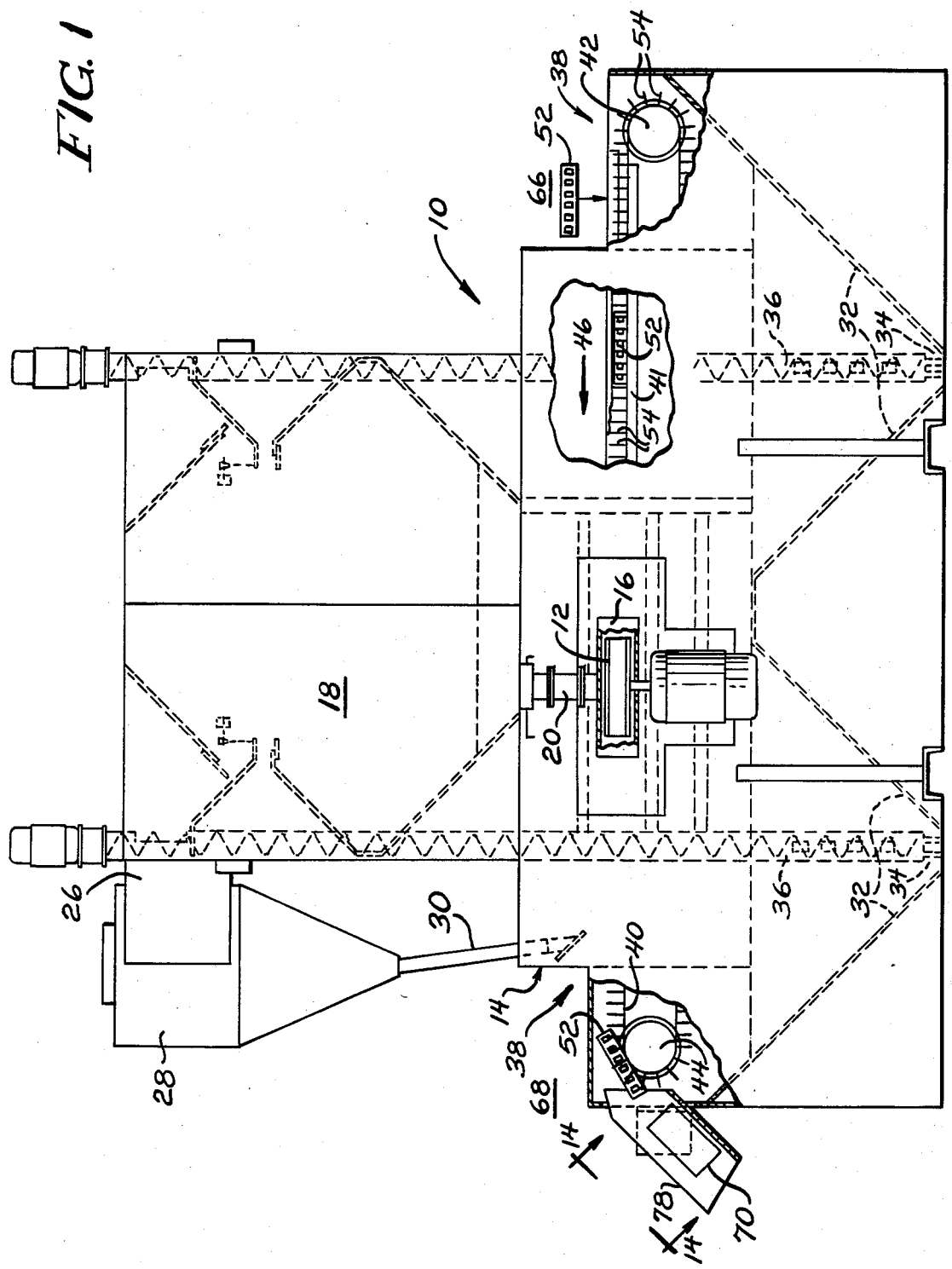
FIG. 1 is a side elevation view of the surface treatment apparatus incorporating the conveyor assembly of the present invention.

Referring particularly to FIGS. 1 and 2, a surface treatment apparatus, generally designated 10, is of the type including a pair of centrifugal blasting wheels preferably of the well known type manufactured by the Material Cleaning Systems Division of Wheelabrator-Frye Inc., located in Mishawaka, Ind. One such centrifugal blasting wheel 12 is shown mounted to the front side of a cabinet 14 (FIG. 1), while the second blasting wheel 13 is symmetrically positioned on the rear side of the cabinet. This cabinet 14 defines a treatment chamber 22 through which the conveyor to be described below passes.

Each centrifugal blasting wheel is contained within a housing 16 for rotation about a vertical axis, thereby to propel the abrasive media under the influence of centrifugal force laterally against the electronic assemblies within the treatment chamber. A variety of media may be employed including metal and non-metallic media such as a plastic media or an agricultural media, such as nut shells. This media is contained within hoppers 18 for admission to the impeller of the blasting wheel through inlet conduits 20, all in a manner well known to those skilled in the art.

An air flow passage 24 is defined between hoppers 18 and establishes air communication between the treatment chamber 22 and duct 26 attached to a cyclone separator 28. This separator, having a discharge tube 30, is provided to separate and discharge dust and foreign material separated from the abrasive media, all in a manner well known to those skilled in the art.

It is noted that the treatment chamber 22 has inclined bottom walls 32 which cause the abrasive media to be directed to the lowermost portions 34 of the treatment chamber. Those lowermost portions of the treatment chamber are in communication with the inlets of a pair of vertically disposed screw conveyors 36, the latter being provided to return the abrasive media to the upper portion of the hoppers 18, again in a manner known to those skilled in the art.

Still referring to FIGS. 1 and 2, the conveyor of the present invention, generally designated 38, is horizontally disposed and suitably mounted so that it extends through the treatment chamber 22. In this regard, the cabinet is provided with suitable inlet and exit openings (not shown) to permit the conveyor to extend therethrough. Specifically, the conveyor is comprised of a continuous belt loop 40 supported by a longitudinal belt guide 41 between inlet and exit end pulleys 42 and 44, respectively. Inlet end pulley 42 is retained on a movable axel 43 permitting the adjustment or regulation of conveyor belt tension while exit end pulley 44 is coupled to an electric motor through a variable speed drive (not shown) thereby facilitating the leftward travel of the upper working span of belt 40 as shown by arrow 46, FIG. 1. A center-rib 48 may be provided on exit pulley 44, FIG. 11, to facilitate removal or ejection of the treated electronic assemblies as discussed below.

Conveyor belt 40 is best illustrated in FIGS. 3, 4, and 5. Uniformly spaced transverse ribs 50 are integrally formed on the outer surface of belt 40 and function to receive and position the electronic assemblies 52 during transit through the treatment chamber. Ribs 50 also serve to minimize the collection of abrasive shot material on the belt during treatment operations. A plurality of retention fingers or pins 54 are positioned around the full longitudinal circumference of the belt and form a pair of parallel spaced rows 56 and 58 (FIG. 5) of component retention pins. These pins are adapted to receive and retain component assemblies therebetween during transit through the surface treatment chamber 22. All or selected pins 54 are bent outwardly at a level substantially adjacent the component assemblies therein to facilitate component retention, FIGS. 9 and 13. The transverse manipulation of pins 54 to effect the receipt, retention, and ejectment of each electronic assembly treated by the above apparatus is described in detail below.

Referring to FIGS. 3, 5, and 6, pins 54 are preferably fabricated in U-shaped pairs wherein each leg of the U-shaped member 62 defines a separate retention pin 54. In this configuration, the pins may be inserted and retained in holes provided through the belt or, alternatively, the pin members 62 may be integrally incorporated during manufacture of the belt itself. In either event, the pin members 62 are each positioned within a given row 56, 58 such that the respective pin member cross pieces are oriented along the longitudinal belt axis and provide no added lateral rigidity or support for the belt. This is required, as will be seen below with reference to the description of the exit pulley of FIG. 11, in order to permit deformation of the belt along the lateral belt axis thereby facilitating the effortless and automatic ejection of treated component assemblies.

Figure 8:
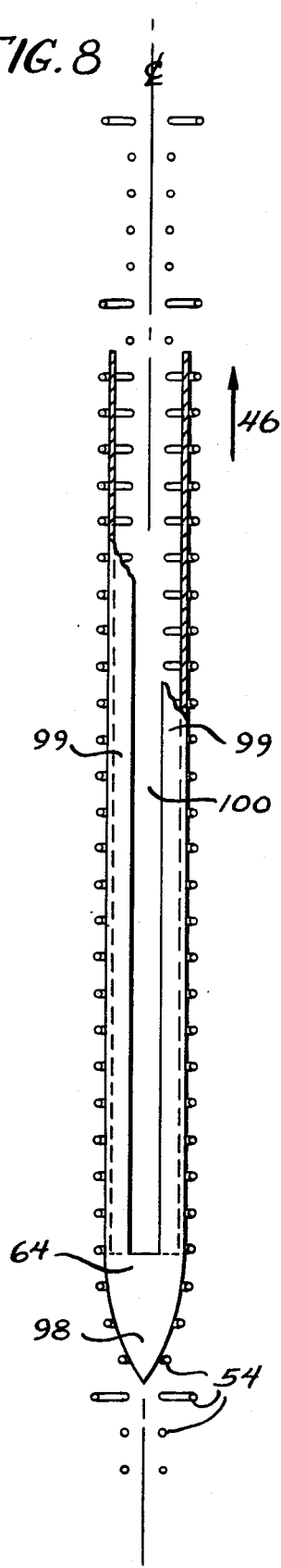
FIG. 8 is a fragmentary plan view of the loading zone with retention pins rotated outwardly by the slotted wedge shoe.
Figure 12:
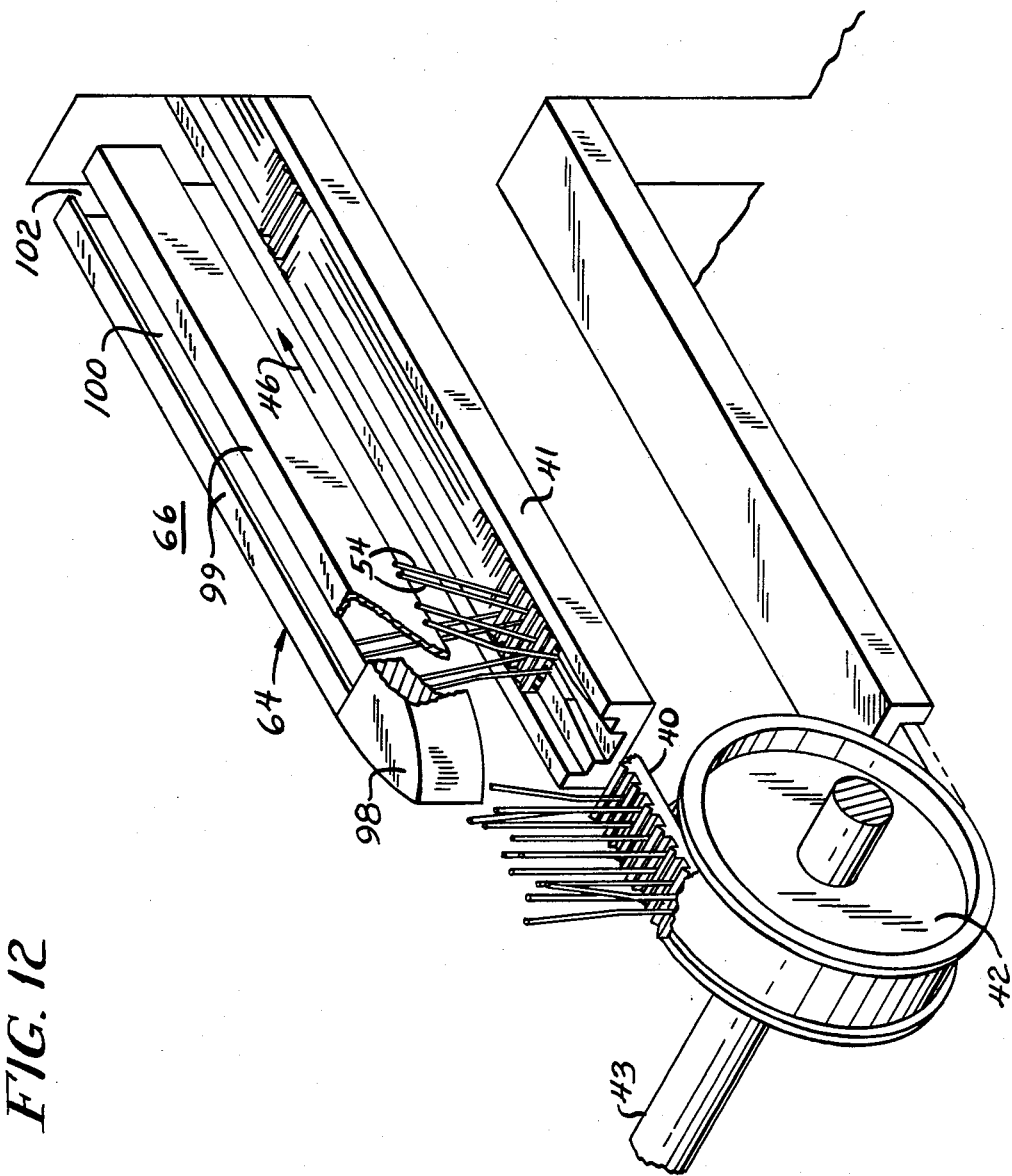
FIG. 12 is a perspective view of the loading zone of the present conveyor assembly of the present invention.

The surface treatment apparatus 10 defines three generally separate regions or zones along conveyor 38. Referring to FIGS. 1 and 12, a loading zone 66 is shown on the inlet or righthand end of the conveyor (FIG. 1) wherein untreated component assemblies 52 are positioned on the conveyor between the parallel longitudinal rows of pins. The pins are rotated outwardly in a plane transverse to the direction of belt travel, as illustrated in FIGS. 7, 8 and 12, thereby enabling component assemblies to be freely inserted through the wedge-shaped shoe 64 and positioned on the belt between the separated rows of pins. The pin rotation shoe 64 of the present invention is considered in detail below.

The surface treatment chamber 22 defines the second zone along the conveyor 38. As previously indicated, a pair of centrifugal blast wheels 12 are affixed on opposite sides of cabinet 14 in spaced relationship along the conveyor. The component assemblies must be securely retained between pin rows 56 and 58 against the air or particle blast force from wheels 12. The pin clamping structure of the present invention is considered in detail below.

The final or outlet zone 68 is defined by the region to the lefthand side of chamber 22 (FIG. 1) and may include a component assembly washer 70 between two pairs of powered sponge feed rollers 72. Assembly washer 70 includes a pair of opposed brushes 74 arranged bristle tip-to-tip. A liquid solution is fed into the brushes, at 76, and functions as a flushing agent to carry away dust dislodged by the brushes from the parts. The feed rollers 72 force the component assembly through the brushes and out a discharge chute 78. A blower dryer (not shown) can be added to remove moisture from the deflashed cleaned parts.

Figure 11:
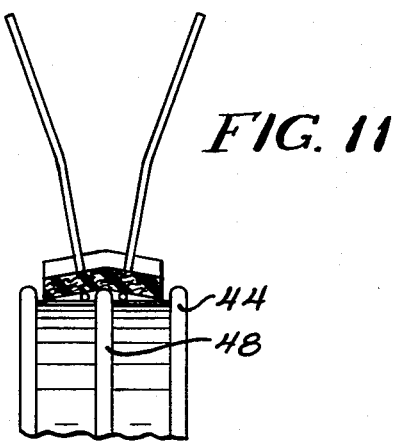
FIG. 11 is a fragmentary end view of the exit pulley showing the integral center-rib with a cross-sectional view of the deformed conveyor belt and retention pins thereon.

Release of the deflashed component assemblies from the conveyor 38 is automatically effected by the ribbed exit pulley 44, FIG. 11. An integral center-rib 48 urges the center of the conveyor belt 40 radially outwardly as it passes over the pulley which, in turn, causes the outward pivotal rotation of pins 54 and the corresponding release of component assemblies 52. The momentum of the component assemblies on the conveyor carries these assemblies into the powered drive rollers 72 or chute 78 as appropriate.

A preferred arrangement for pivoting or spreading the pins in the loading zone is the slotted wedge-like shoe such as shown at 64 in FIGS. 7 and 8. The generally U-shaped shoe 64 is secured from above and may project downwardly from automatic component insertion apparatus (not shown). Shoe 64 is positioned between the parallel rows of retention pins adjacent the upper tips thereof. The shoe includes a body portion comprising a pair of spaced parallel pin guides 98 and a wedge-shaped tip member 99 in abutting contact therewith. A vertically disposed component receiving slot 100 is defined between guides 98.

In operation, the retention pins 54 contact the tapered surface of tip member 99 and are thereby urged transversely outwardly as the conveyor belt progresses along the shoe (indicated by arrow 46) from the tip to the pin guides adjacent slot 100. In this manner, the respective transverse pin pairs are separated permitting the unrestricted entry of component assemblies 52 through slot 100 of shoe 64. These component assemblies, in turn, come to rest on the conveyor belt substantially as shown in FIG. 3 and are thereafter carried by the moving conveyor into the treatment chamber. As the assembly moves from the shoe region, the retention pins pivot inwardly into contact with the assembly.

Figure 9:
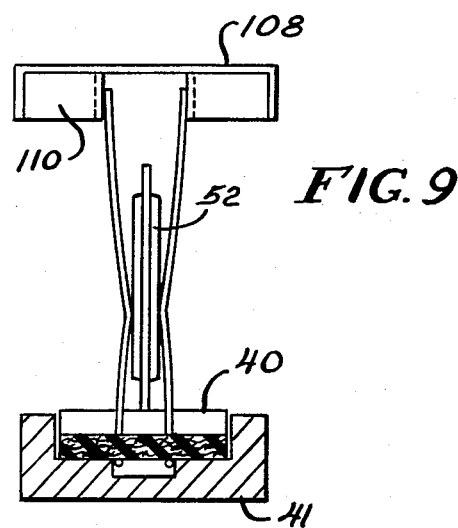
FIG. 9 is a sectional view along line 9—9 of FIG. 13 showing the conveyor belt assembly in the treatment chamber wherein retention pins are shown in secure engagement with a component assembly under the constricting action of the U-shaped upper channel.
Figure 10:
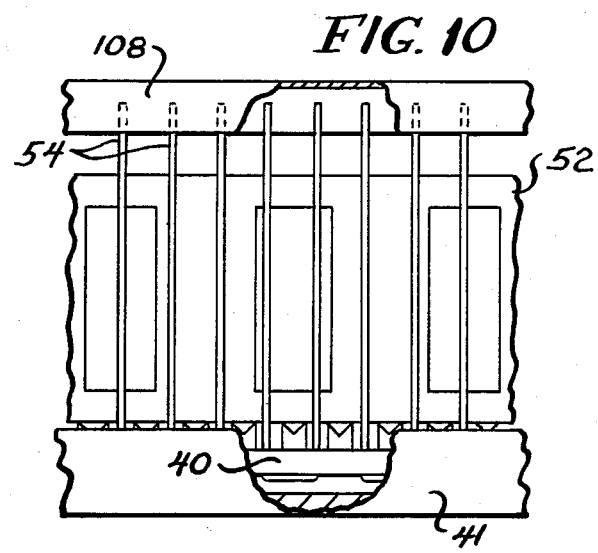
FIG. 10 is a fragmentary side elevation view of the conveyor belt assembly in the treatment chamber with portions broken away to reveal details of the belt and retention pins.

Retention and movement of the component assemblies through the treatment chamber 22 is illustrated in FIGS. 9, 10, and 13. As previously indicated, the force of air and/or particles from blast wheels 12 requires that the component assemblies 52 be securely held during their passage through this chamber. A preferred arrangement for assuring component assembly retention includes an inverted U-shaped channel 108 positioned above and parallel to the conveyor belt and guide assembly. This channel is adapted to receive the tips of pins 54, only, and is open therebelow to define a generally unobstructed surface treatment zone in which the laterally directed blasts from wheels 12 freely impinge on the component assemblies traveling along the conveyor. A tapered entrance 110 is provided on the inlet end of channel 108 to receive the upper tips of pins 54. The pins are urged transversely inwardly as they pass through the tapered entrance 110 into the narrower channel 108. The width of channel 108 is selected to assure sufficient compressive contact between the pins and component assemblies. It will be appreciated that the bent contour of pins 54 maximizes the compressive force applied to the component asssemblies thereby assuring their proper retention. Channel 108 extends only to the limits of the surface treatment zone 22. As the assemblies pass from this zone, the conveyor pins exit channel 108 thereby returning to their nominal position. The assemblies then pass over the exit end pulley 44 and into cleaner 70 or chute 78 as previously considered.

It will be appreciated from the above that the present invention provides a novel conveyor arrangement for transporting and retaining relatively flat circuit or component assemblies through a surface treatment apparatus. Further, these assemblies must be maintained in a vertical plane along the conveyor whereby the blast from the treatment wheels impinges in a generally perpendicular manner to the assembly surfaces. The present invention uniquely combines a plurality of spaced pins defining two parallel rows along a conveyor belt with appropriate slotted shoes, contriction channels and ribbed pulley to form a unique and automatically operative structure for the loading, rigid retention and release of component assemblies traversing the treatment chamber. Of particular advantage to the instant invention is the arrangement of the loading zone wherein untreated assemblies are effortlessly positioned on the conveyor for subsequent and automatic treatment. This arrangement includes a slotted shoe adapted to pivot the retention pins outwardly thereby facilitating the unrestricted entry of the untreated assemblies onto the conveyor belt through the shoe slot. A further advantage of the present invention includes the automatic retention of component assemblies while in the treatment chamber and the automatic release of treated assemblies as they pass over a center-ribbed exit end pulley. In short, the present invention is particularly adapted to provide the required retention and movement of relatively large, flat assemblies with an absolute minimum of human interaction.

What is claimed:
1. A conveyor apparatus for transporting elongated work pieces through a surface treatment chamber or the like, including a continuous loop belt means retained between two pulleys defining opposite ends of the conveyor belt loop; one of the pulley means operatively coupled to a motor to drive the belt means; a plurality of resilient retention pins on the belt means extending outwardly from a surface thereof, the pins defining a pair of spaced parallel rows extending around the longitudinal circumference of the belt means; a loading zone generally at one end of the belt means including means for applying a force on the outward ends of the pins for transversely separating the pins defining the pin rows thereby creating an opening therebetween adapted to receive the work pieces; means in the treatment chamber for applying a force on the outward ends of the pins for urging the pins transversely inwardly into secure engagement with a work piece therein; means for releasing the pins from engagement with the work pieces following surface treatment or the like.

2. The conveyor apparatus of claim 1 further including an elongated belt means guide member having a belt receiving channel therein, the guide member secured immediately below the upper span of the belt means and extending longitudinally thereunder, said guide means precluding transverse lateral movement of the belt means.

3. The conveyor apparatus of claim 1 wherein the means for applying a force for transversely separating the pin rows in a wedge shaped shoe means disposed between the pin rows; whereby the respective pin rows are automatically pivoted outwardly as they engage the wedge shaped shoe means.

4. The conveyor apparatus of claim 1 wherein the means in the treatment chamber for applying a force for urging the pins transversely inwardly includes an inverted U-shaped channel spaced parallel to and above the belt means surface whereby the upper tips of the pins are received between the downwardly extending channel walls: the channel including a flared opening and a constricted main channel body whereby the pins are received within the flared opening and urged transversely inwardly as they enter the channel body.

5. The conveyor apparatus of claim 4 wherein the pins are bent laterally outwardly with respect to the axis of the belt thereby providing enhanced retention of the work pieces in the surface treatment chamber.

6. The conveyor apparatus of claim 1 wherein a U-shaped pin member is retained by the belt, the pin member defining a pair of adjacent retention pins.

7. The conveyor apparatus of claim 6 wherein the pair of pins of any pin member is defined in a single pin row thereby maintaining the belt flexibility along the lateral belt axis.

8. A conveyor apparatus for transporting elongated work pieces through a surface treatment chamber or the like, including a continuous loop belt means retained between two pulleys defining opposing ends of the conveyor belt loop; one of the pulley means operatively coupled to a motor to drive the belt means; a plurality of retention pins on the belt means extending outwardly from a surface thereof, the pins defining a pair of spaced parallel rows extending around the longitudinal circumference of the belt means; a loading zone generally at one end of the belt means including means for transversely separating the pins defining the pin rows thereby creating an openinng therebetween adapted to receive the work pieces; the means for transversely separating the pin rows is a wedge shaped shoe means disposed between the pin rows whereby the respective pins rows are automatically pivoted outwardly as they engage the wedge shaped shoe means; the shoe means includes an elongated aperture through which untreated work pieces are passed to the belt means; means in the treatment chamber for urging the pins transversely inwardly into secure engagement with a work piece therein; means for releasing the pins from engagement with the work pieces following surface treatment or the like.

9. A conveyor apparatus for transporting elongated work pieces through a surface treatment chamber or the like; including a continuous loop belt means retained between two pulleys defining opposing ends of the conveyor belt loop; one of the pulley means operatively coupled to a motor to drive the belt means; a plurality of retention pins on the belt means extending outwardly from a surface thereof, the pins defining a pair of spaced parallel rows extending around the longitudinal circumference of the belt means; a loading zone generally at one end of the belt means including means for transversely separating the pins defining the pin rows thereby creating an opening therebetween adapted to receive the work pieces; means in the treatment chamber for urging the pins transversely inwardly into secure engagement with a work piece therein; means for releasing the pins from engagement with the work pices following surface treatment or the like wherein the means for releasing the pins from engagement with the work piece includes a center-ribbed exit pulley whereby the conveyor belt is deformed as it passes over the ribbed pulley thereby spreading the parallel rows of pins.

* * * * *